(12) United States Patent
Pendse

(10) Patent No.: US 8,987,014 B2
(45) Date of Patent: Mar. 24, 2015

(54) SEMICONDUCTOR WAFER AND METHOD OF FORMING SACRIFICIAL BUMP PAD FOR WAFER PROBING DURING WAFER SORT TEST

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 797 days.

(21) Appl. No.: 12/467,094

(22) Filed: May 15, 2009

(65) Prior Publication Data

US 2009/0289253 A1 Nov. 26, 2009

Related U.S. Application Data

(60) Provisional application No. 61/054,913, filed on May 21, 2008.

(51) Int. Cl.
*H01L 21/66* (2006.01)
*H01L 23/31* (2006.01)

(52) U.S. Cl.
CPC ........... *H01L 22/32* (2013.01); *H01L 23/3128* (2013.01); *H01L 2924/1433* (2013.01); *H01L 2924/0002* (2013.01)
USPC ........ 438/18; 257/48; 257/E21.523; 257/737; 257/738; 438/613

(58) Field of Classification Search
CPC ................ H01L 22/32; H01L 23/3128; H01L 2924/1433; H01L 2924/0002
USPC ................ 438/17, 18, 613; 257/48, 737, 738, 257/E21.523
See application file for complete search history.

(56) References Cited

U.S. PATENT DOCUMENTS

| | | | |
|---|---|---|---|
| 5,554,940 A * | 9/1996 | Hubacher | 324/762.03 |
| 5,597,737 A | 1/1997 | Greer et al. | |
| 5,719,449 A * | 2/1998 | Strauss | 257/786 |
| 6,306,751 B1 * | 10/2001 | Patel et al. | 438/614 |
| 6,359,342 B1 * | 3/2002 | Yuan et al. | 257/784 |
| 6,429,029 B1 * | 8/2002 | Eldridge et al. | 438/14 |
| 6,534,853 B2 * | 3/2003 | Liu et al. | 257/692 |
| 6,551,844 B1 * | 4/2003 | Eldridge et al. | 438/14 |

(Continued)

OTHER PUBLICATIONS

IBM Technical Disclosure Bulletin, "Wafer Burn-In", Volumn No. 26, Issue No. 10A, Mar. 1984, pp. 4916-4918.*

*Primary Examiner* — Mary Wilczewski
(74) *Attorney, Agent, or Firm* — Robert D. Atkins; Patent Law Group: Atkins and Associates, P.C.

(57) ABSTRACT

A semiconductor wafer contains a plurality of semiconductor die. A plurality of interconnect bump pads is formed over the semiconductor die. A plurality of sacrificial bump pads is formed in proximity to and diagonally offset with respect to the interconnect bump pads. The sacrificial bump pads have a different diameter than the interconnect bump pads. A conductive link is formed between each interconnect bump pad and proximate sacrificial bump pad. The sacrificial bump pads, interconnect bump pads, and conductive link are formed concurrently or during bump formation. The wafer is electrically tested by contacting the sacrificial bump pads. The electrical test identifies known good die and defective die. The sacrificial bump pads and a portion of the conductive link are removed after wafer probing. Bumps are formed over the interconnect bump pads. The semiconductor wafer can be sold or transferred to a third party after wafer probing without bumps.

19 Claims, 5 Drawing Sheets

(56) References Cited

U.S. PATENT DOCUMENTS

| | | | |
|---|---|---|---|
| 6,753,547 B2 * | 6/2004 | Devereaux | 257/48 |
| 6,764,879 B2 * | 7/2004 | Nagao et al. | 438/110 |
| 6,765,228 B2 * | 7/2004 | Lin et al. | 257/48 |
| 6,825,052 B2 * | 11/2004 | Eldridge et al. | 438/15 |
| 6,878,963 B2 | 4/2005 | Fang | |
| 6,911,357 B2 * | 6/2005 | Devereaux | 438/132 |
| 6,972,583 B2 * | 12/2005 | Fang | 324/754.03 |
| 7,008,818 B2 * | 3/2006 | Liu et al. | 438/106 |
| 7,105,917 B2 * | 9/2006 | Cho et al. | 257/678 |
| 7,221,173 B2 * | 5/2007 | Bachman et al. | 324/754.03 |
| 7,557,596 B2 * | 7/2009 | Eldridge et al. | 324/750.3 |
| 7,662,672 B2 * | 2/2010 | Lin | 438/123 |
| 7,910,922 B2 * | 3/2011 | Nishimura et al. | 257/50 |
| 7,969,180 B1 * | 6/2011 | Jeon et al. | 326/16 |
| 8,022,508 B2 * | 9/2011 | Miki | 257/620 |
| 8,101,433 B2 * | 1/2012 | Akiba et al. | 438/15 |
| 8,309,373 B2 * | 11/2012 | Abiru | 438/18 |
| 2003/0032263 A1 * | 2/2003 | Nagao et al. | 438/462 |
| 2003/0042483 A1 * | 3/2003 | Devereaux | 257/48 |
| 2003/0042600 A1 * | 3/2003 | Devereaux | 257/723 |
| 2008/0042275 A1 | 2/2008 | Kuan et al. | |
| 2008/0135841 A1 * | 6/2008 | Miki | 257/48 |
| 2008/0197353 A1 * | 8/2008 | Takahashi et al. | 257/48 |
| 2009/0087953 A1 * | 4/2009 | Lin | 438/123 |

* cited by examiner

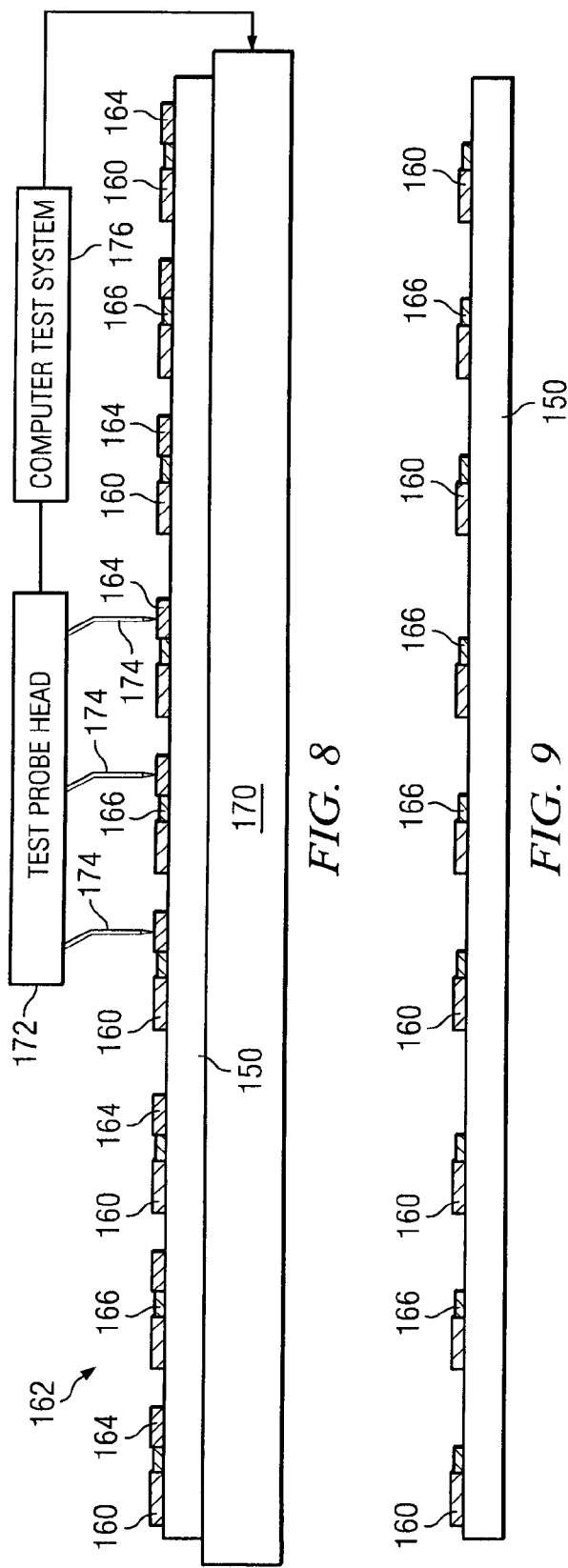
FIG. 8
FIG. 9
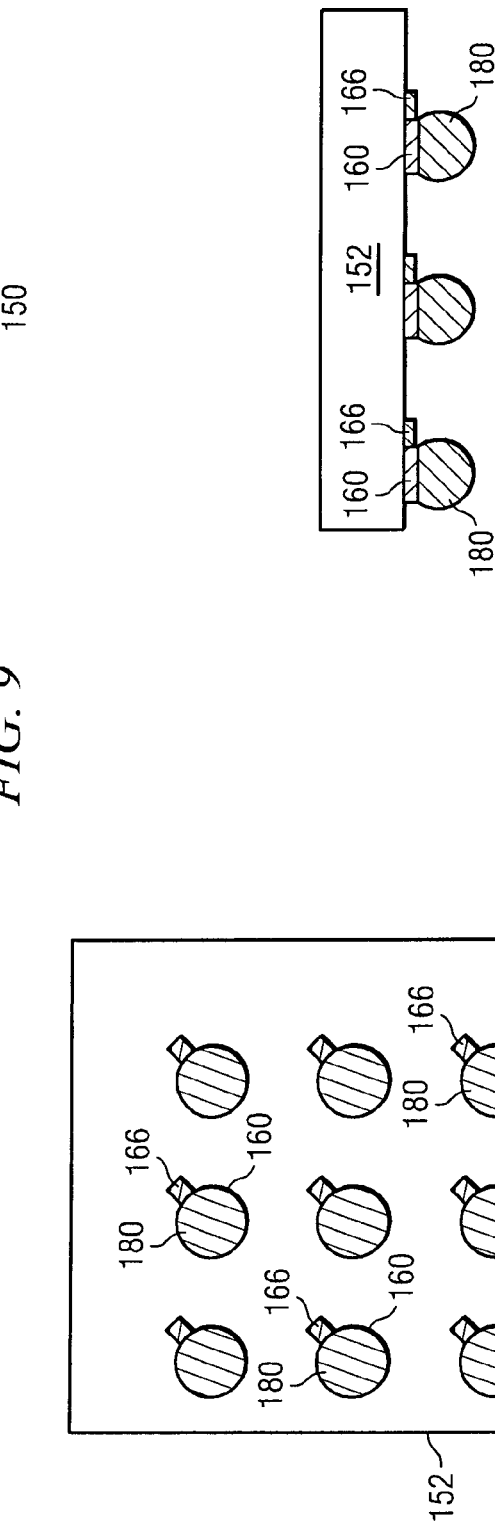
FIG. 10a
FIG. 10b

SEMICONDUCTOR WAFER AND METHOD OF FORMING SACRIFICIAL BUMP PAD FOR WAFER PROBING DURING WAFER SORT TEST

CLAIM TO DOMESTIC PRIORITY

The present non-provisional application claims the benefit of priority of U.S. Provisional Application Ser. No. 61/054,913, filed May 21, 2008.

FIELD OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 illustrates a conventional semiconductor wafer 10 containing a plurality of semiconductor die 12. Wafer 10 can be made with a semiconductor base material such as silicon, germanium, gallium arsenide, indium phosphide, or silicon carbide. Each semiconductor die 12 has active and passive devices, conductive layers, and dielectric layers formed in its active surface according to the electrical design of the die. In one embodiment, the semiconductor die contains baseband analog circuits or digital circuits, such as digital signal processor (DSP), memory, or other signal processing circuit. Semiconductor die 12 may also contain integrated passive devices (IPD), such as inductors, capacitors, and resistors, for radio frequency (RF) signal processing.

Semiconductor die 12 are flipchip type semiconductor devices with bump pads 14 formed on the active surface. Bump pad 14 provides electrical interconnect to conductive layers and active and passive circuit components within semiconductor die 12. Solder bumps are typically formed on bump pads 14 to electrical interconnect semiconductor die 12 to a printed circuit board (PCB) and other electrical devices after wafer singulation.

Wafer testing is an important part of the manufacturing process to confirm continuity, electrical parameters, and functional operation of semiconductor die 12. Defective die are identified at the wafer level and removed from the manufacturing process to avoid failures in higher level systems, e.g., multi-die packages and PCB, which is a more expensive failure.

FIG. 2 shows a conventional wafer probe testing configuration for semiconductor wafer 10. Wafer 10 is mounted to wafer handler 16, which provides wafer travel in x, y, and z directions for testing purposes. Wafer 10 is maneuvered so that test probe head 18 with contact fingers or needles 20 electrically contact bump pads 14. Computer test system 22 sends and receives electrical signals through test probe head 18 and contact fingers 20 to bump pads 14. Computer test system 22 tests the continuity, electrical parameters, and functional operation of semiconductor die 12 through bump pad 14. If computer test system 22 detects a test failure, the defective semiconductor die is identified and later removed from the manufacturing process.

Bump pad 14 has a small area, on the order of 50-500 micrometers (μm) in diameter. Contact finger 20 typically has a sharp tip to make solid electrical connection to bump pad 14. During the wafer probe testing process, contact finger 20 is known to penetrate the surface and damage bump pad 14. In fact, the wafer probe testing may involve dragging contact finger 20 across bump pad 14, which leaves a scratch across the surface of the bump pad. The wafer probe testing leaves contact finger marks in the bump pad, which makes later formation of the solder bump prone to failure. To avoid damage to bump pads 14, wafer probe testing has been conducted after formation of solder bumps 24, as shown in FIG. 3.

In most business contracts, the wafer foundry is required by its customers to retain responsibility for the wafer until wafer sort test is complete to insure adequate yield. Due to the potential to bump pad damage, many wafer foundries perform wafer probing after formation of solder bumps on the bumps pads. The wafer foundry cannot sell or otherwise transfer responsibility of the wafer until after wafer sort test and the foundry cannot conduct wafer sort test until after the bumps are formed. However, requiring that wafer probing be conducted after bumping limits competition for third-party bumping service providers. If wafer probing could be conducted prior to bumping without damaging the bump pad, then the wafer foundry could sell unbumped wafers and other companies could get involved in providing bumping services.

SUMMARY OF THE INVENTION

A need exists to perform wafer probe testing prior to bumping without damaging the interconnect bump pad. Accordingly, in one embodiment, the present invention is a method of making a semiconductor device comprising the steps of providing a semiconductor wafer containing a plurality of semiconductor die, forming a plurality of interconnect bump pads over the semiconductor die, forming a plurality of sacrificial bump pads in proximity to the interconnect bump pads, forming a conductive link between each interconnect bump pad and proximate sacrificial bump pad, and wafer probing by electrically contacting the sacrificial bump pads prior to formation of bumps on the interconnect bump pads.

In another embodiment, the present invention is a method of making a semiconductor device comprising the steps of providing a semiconductor wafer containing a plurality of semiconductor die, and concurrently forming a plurality of interconnect bump pads, plurality of sacrificial bump pads, and conductive link over the semiconductor die. The sacrificial bump pad is disposed in proximity to the interconnect bump pads. The conductive link is electrically connected between each interconnect bump pad and proximate sacrificial bump pad. The method further includes the step of wafer probing by electrically contacting the sacrificial bump pads.

In another embodiment, the present invention is a method of making a semiconductor device comprising the steps of providing a semiconductor wafer containing a plurality of semiconductor die, forming an interconnect bump pad over the semiconductor die within a bump pad array, forming a sacrificial bump pad within the bump pad array, forming a conductive link between the interconnect bump pad and sacrificial bump pad, and wafer probing by electrically contacting the sacrificial bump pad.

In another embodiment, the present invention is a semiconductor wafer containing a plurality of semiconductor die comprising an interconnect bump pad formed over the semiconductor die within a bump pad array. A sacrificial bump pad is formed within the bump pad array. A conductive link is formed between the interconnect bump pad and sacrificial bump pad.

BRIEF DESCRIPTION OF THE DRAWINGS

FIG. 8 is a wafer probing test configuration for the semiconductor die with the sacrificial bump pads;

FIG. 9 illustrates the wafer following removal of the sacrificial bump pads; and FIGS. 10a-10b illustrate the wafer with bumps formed over the interconnect bump pads after removal of the sacrificial bump pads.

DETAILED DESCRIPTION OF THE DRAWINGS

Figure 1:
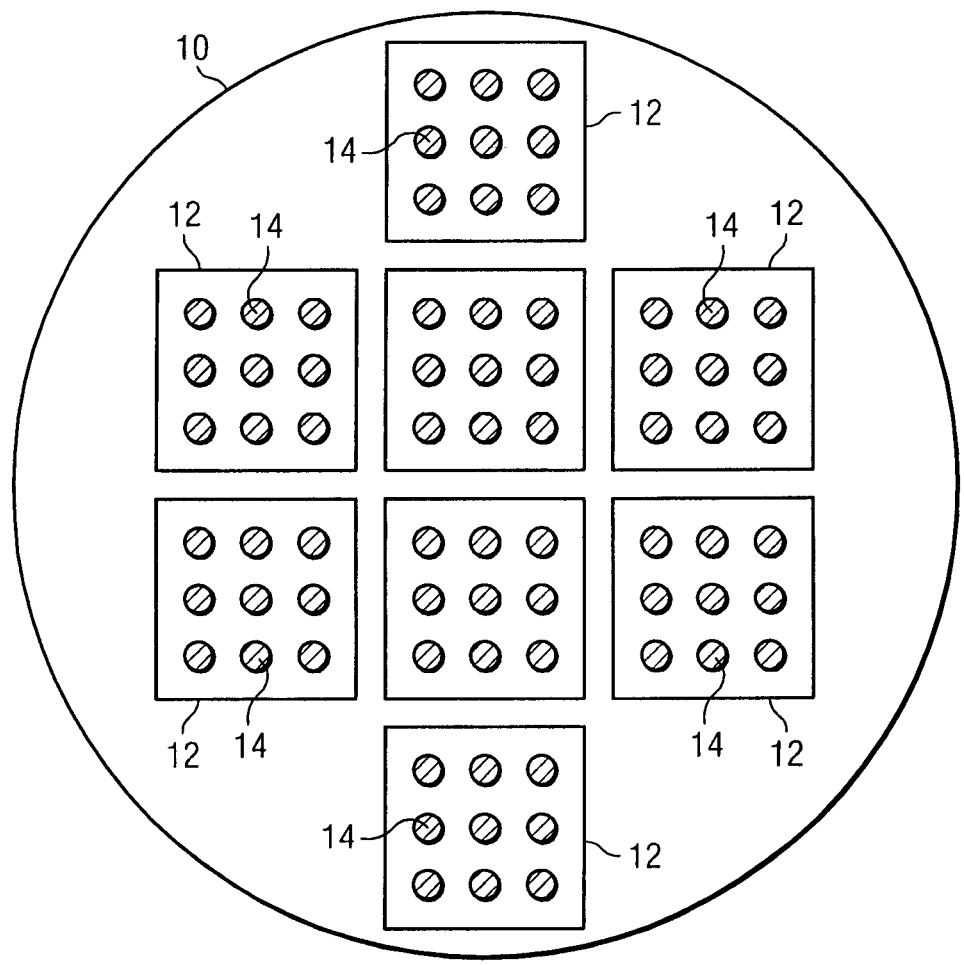
FIG. 1 illustrates a conventional semiconductor wafer with a plurality of die containing bump pads.
Figure 2:
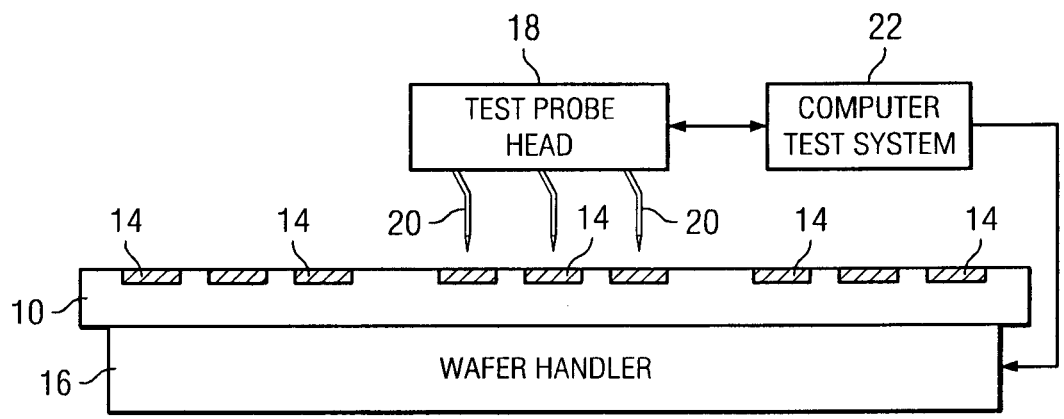
FIG. 2 is a conventional wafer probing test configuration over bump pads.
Figure 3:
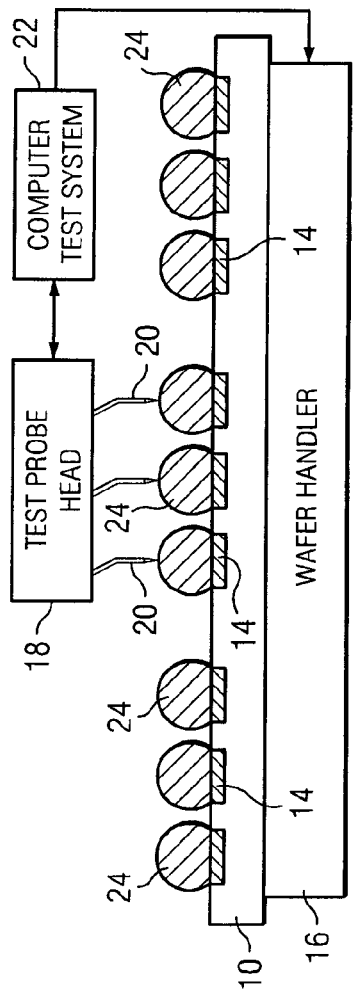
FIG. 3 is a conventional wafer probing test configuration over solder bumps.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
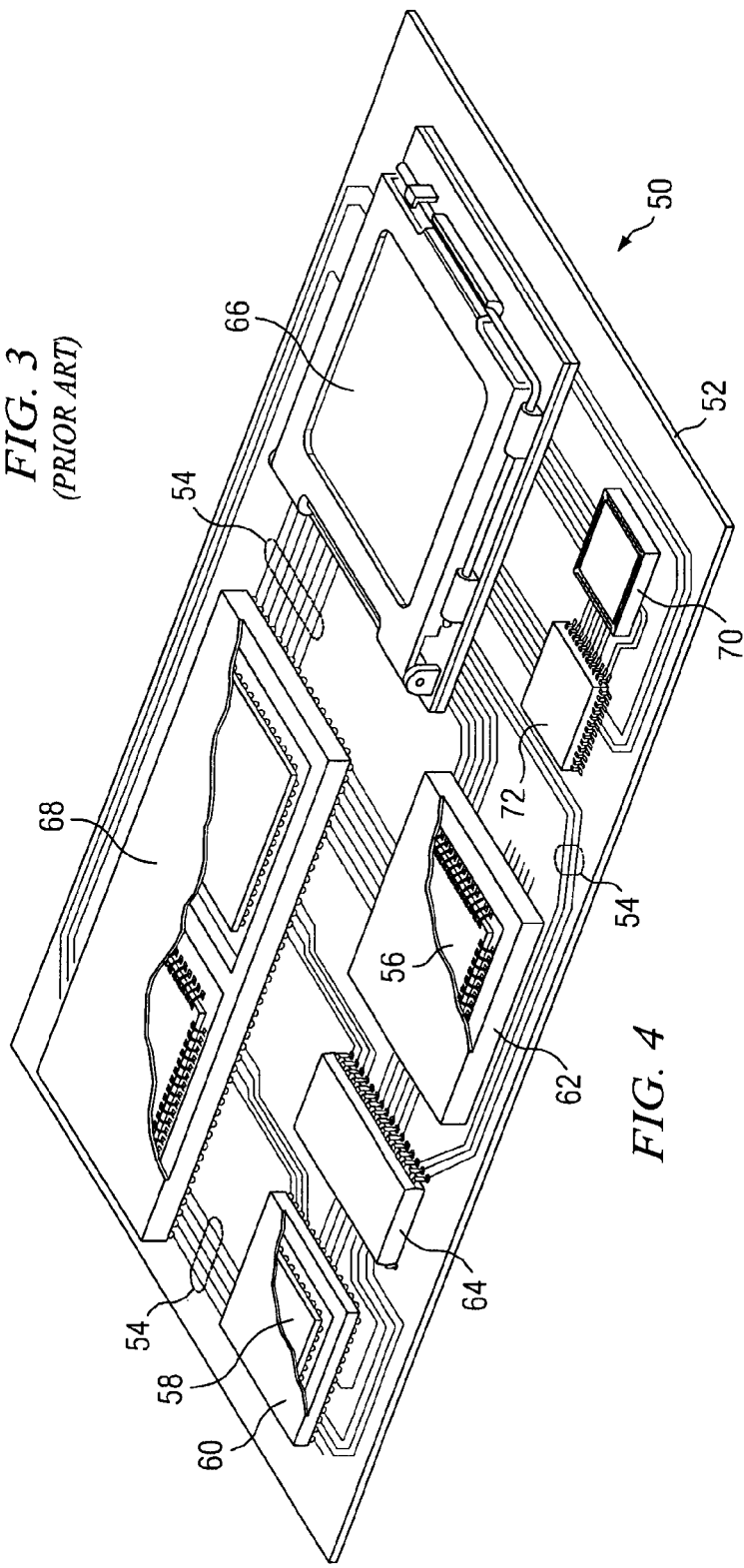
FIG. 4 illustrates a PCB with different types of packages mounted to its surface.

FIG. 4 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 4 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
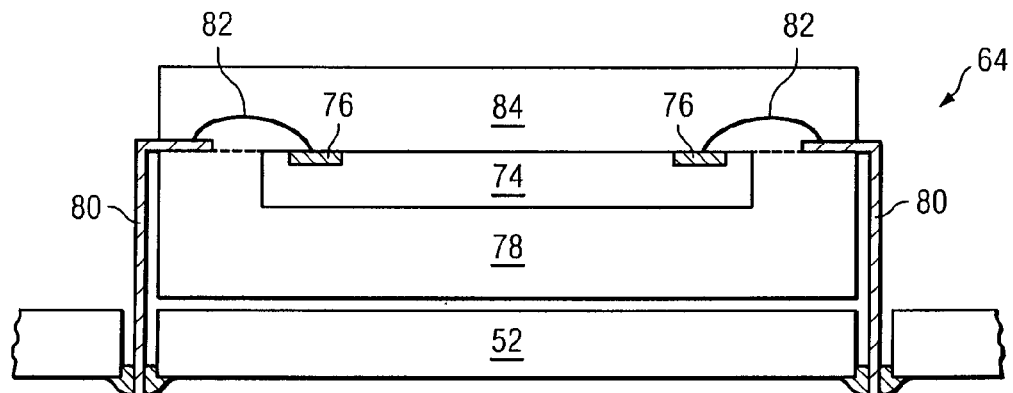
FIGS. 5a-5c illustrate further detail of the representative semiconductor packages mounted to the PCB.
Figure 5B:
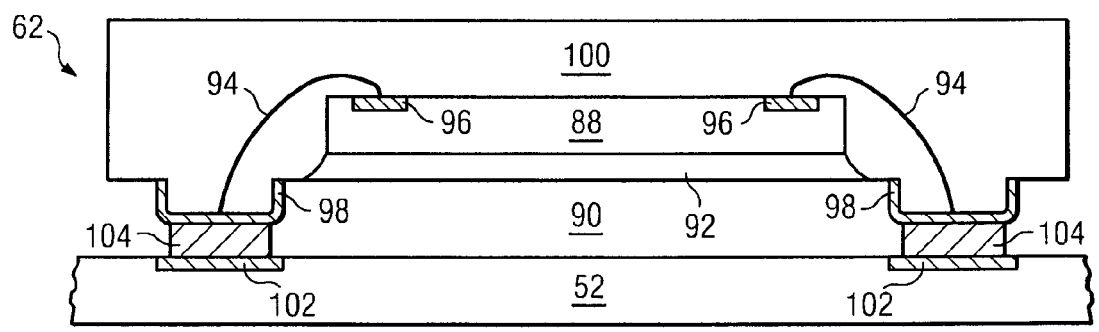
Figure 5C:
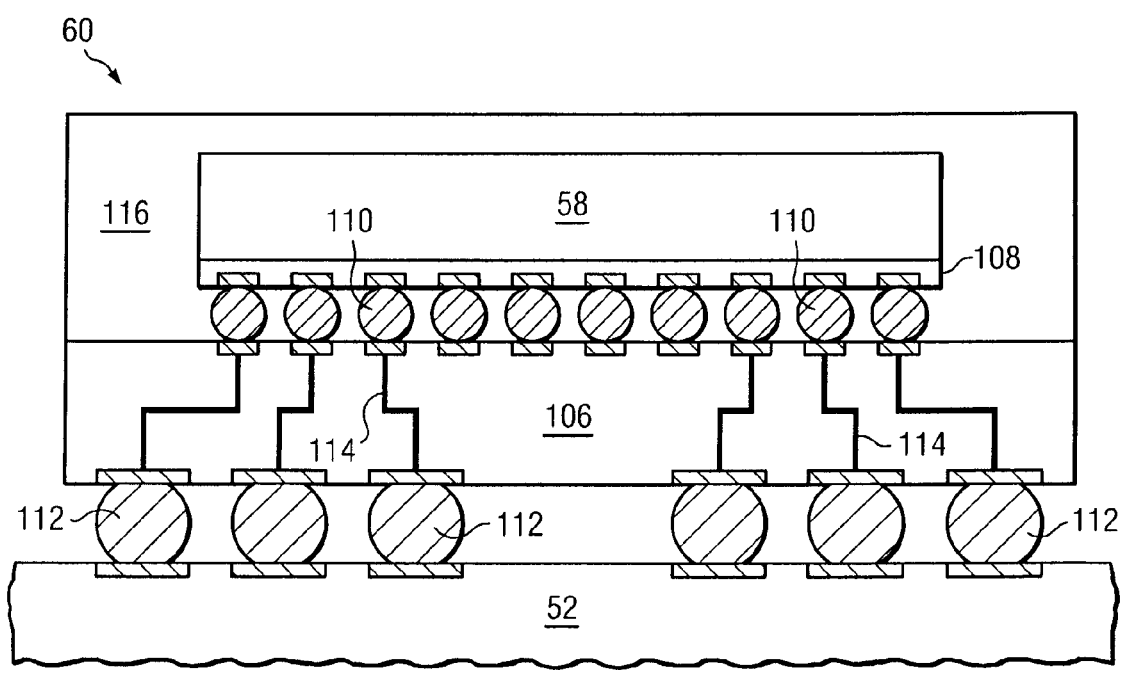

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 5b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 6:
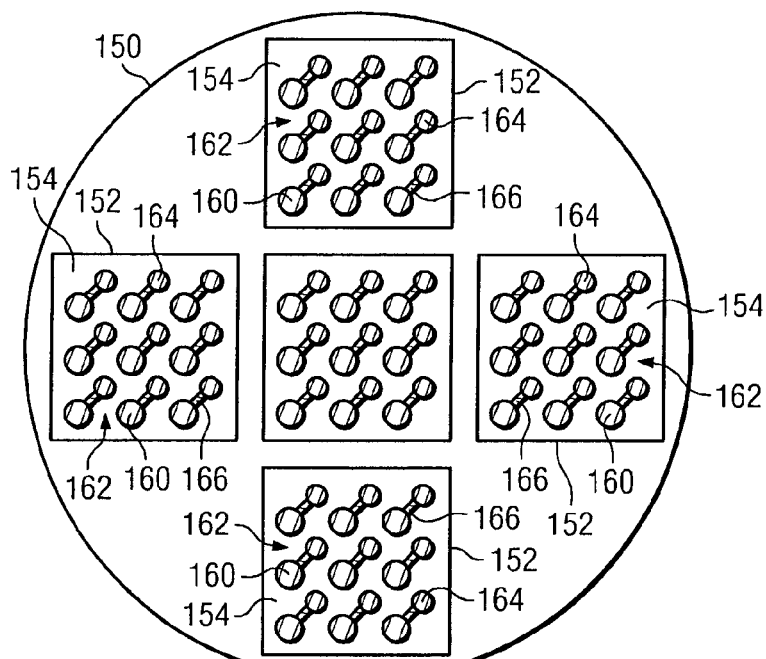
FIG. 6 illustrates a semiconductor wafer with a plurality of die containing interconnect bump pads and sacrificial bump pads interconnected by a conductive link.

FIG. 6 illustrates a semiconductor wafer 150 containing a plurality of semiconductor die 152. Wafer 150 can be made with a semiconductor base material such as silicon, germanium, gallium arsenide, indium phosphide, or silicon carbide with a diameter ranging from 150-300 millimeters (mm). Each semiconductor die 152 has active and passive devices, conductive layers, and dielectric layers formed in active surface 154 according to the electrical design of the die. In one embodiment, semiconductor die 152 contains baseband analog circuits or digital circuits, such as digital signal processor (DSP), ASIC, memory, or other signal processing circuit. Semiconductor die 152 may also contain IPD, such as inductors, capacitors, and resistors, for RF signal processing.

In one embodiment, semiconductor die 152 are flipchip type semiconductor devices with interconnect bump pads 160 formed on active surface 154. Bump pad 160 is patterned and deposited using PVD, CVD, sputtering, electrolytic plating, electroless plating process, or other suitable metal deposition process. Bump pad 160 can be one or more layers of Al, Cu, Sn, Ni, Au, Ag, or other suitable electrically conductive material. Bump pads 160 are disposed within bump pad array 162 to provide electrical interconnect to conductive layers and active and passive circuit components within semiconductor die 152. Bump pad 160 has a small area, on the order of 50-500 micrometers (μm) in diameter.

A plurality of sacrificial bump pads 164 are formed on active surface 154. Bump pad 164 is patterned and deposited using PVD, CVD, sputtering, electrolytic plating, electroless plating process, or other suitable metal deposition process. Bump pad 164 can be one or more layers of Al, Cu, Sn, Ni, Au, Ag, or other suitable electrically conductive material. Sacrificial bump pad 164 may have a smaller or larger area than interconnect bump pad 160. In general, sacrificial bump pad 164 has a diameter on the order of the diameter of interconnect bump pad 160 or that which is suitable for wafer probe testing.

Figure 7A:
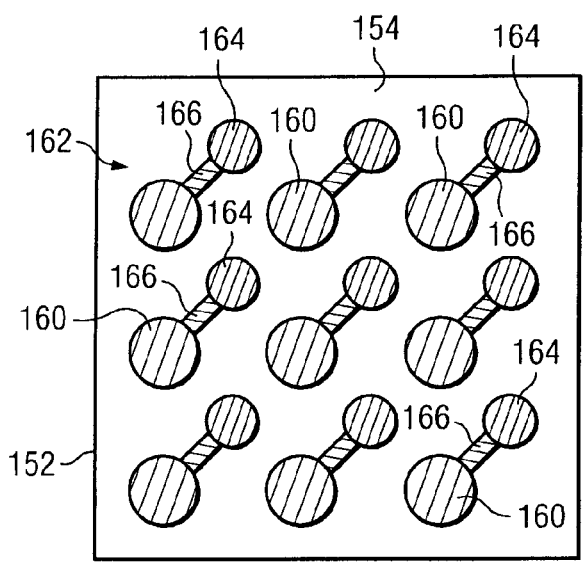
FIGS. 7a-7b illustrate further detail of the interconnect bump pads and sacrificial bump pads interconnected by the conductive link.
Figure 7B:
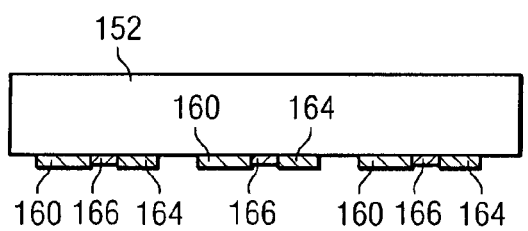

FIGS. 7*a*-7*b* illustrate a top view and cross-sectional view of a portion of semiconductor wafer 150 with further detail of bump pad array 162 of semiconductor die 152. Sacrificial bump pads 164 are disposed interstitially with the array of interconnect bump pads 160. There is one sacrificial bump pad 164 for each interconnect bump pad 160. Each sacrificial bump pad 164 is positioned in proximity to a corresponding interconnect bump pad 160. In one embodiment, sacrificial bump pad 164 is disposed in a diagonally offset location, e.g., one bump pad diameter above and to the right, with respect to the corresponding interconnect bump pad 160, as shown in FIG. 6.

An electrically conductive link 166 is formed over active surface 154 between interconnect bump pads 160 and sacrificial bump pads 164 using patterning with PVD, CVD, sputtering, electrolytic plating, electroless plating process, or other suitable metal deposition process. Conductive link 166 can be one or more layers of Al, Cu, Sn, Ni, Au, Ag, or other suitable electrically conductive material. Conductive link 166 electrically connects interconnect bump pad 160 and sacrificial bump pad 164. Sacrificial bump pad 164 and conductive link 166 can be formed concurrent with interconnect bump pad 160 or during bump formation, which simplifies the manufacturing by avoiding separate processing steps.

FIG. 8 shows a wafer level probe testing configuration for semiconductor wafer 150. Semiconductor die 152 are in wafer form, i.e., prior to singulation, during the probe testing. The wafer level testing confirms continuity, electrical parameters, and functionality of the individual semiconductor die. Each semiconductor die 152 that passes wafer probing is classified as known good die (KGD). Wafer probing can also perform a trimming operation based on the test results to adjust component values, e.g., resistor trim. The wafer probe test identifies defective semiconductor die for removal from the manufacturing process prior to higher level assembly, e.g., multi-die packages and PCBs.

Semiconductor wafer 150 is mounted to wafer handler 170 with vacuum pressure. Wafer handler 170 provides wafer travel in x, y, and z directions for testing purposes. In one embodiment, wafer sort is used to organize and maneuver the wafer for testing. A plurality of semiconductor wafers 150 is placed on a cassette for efficient handling.

A test probe head 172 includes a PCB with a plurality of contact fingers or needles 174 extending radially inward from the PCB to match the compact geometry of bump pad array 162. Contact fingers 174 are typically made with tungsten or other metal having good electrical conductivity and resilient mechanical properties. Contact fingers 174 have 20-30 μm pitch. The distal end of each contact finger 174 is pointed to provide a reliable electrical connection with an associated sacrificial bump pad 164 on bump pad array 162. The PCB of test probe head 172 includes electrical traces that connect to contact fingers 174, which in turn connect to computer test system 176. Computer test system 176 generates and receives test signals for semiconductor die 152 to confirm its continuity, electrical parameters, and electrical functionality. Test probe head 172 may contact one or more semiconductor die 152 on wafer 150. In one embodiment, test probe head 172 contacts one semiconductor die 152 before moving to the next die. Alternatively, test probe head 172 may contact all semiconductor die 152 to test the entirety of wafer 150. Computer test system 176 also controls movement of wafer handler 170. During wafer sort, wafers 150 are loaded and unloaded from the cassette and aligned for testing using automatic pattern recognition.

To conduct a wafer sort test, wafer handler 170 is maneuvered by computer test system 176 to bring contact fingers 174 into pressing engagement with sacrificial bump pads 164. An electrical test signal is generated by computer test system 176, which is routed through test probe head 172 and contact finger 174 to sacrificial bump pad 164. The electrical test signal is also routed to interconnect bump pad 160 by conductive link 166. Semiconductor die 152 processes the electrical test signal over a range of operating temperatures, depending on the test being executed. A test result signal is routed back through interconnect bump pad 160, conductive link 166, sacrificial bump pad 164, contact finger 174, and test probe head 172 to computer test system 176. Each semiconductor die 152 is classified as a KGD, or identified as defective, depending on the test results. If computer test system 176 detects a test failure, the defective semiconductor die is identified with an ink dot or recorded in the computer test system for later removal from the manufacturing process.

Contact finger 174 typically has a sharp tip to make solid electrical connection to bump pad 164. During the wafer probe testing process, contact finger 174 is known to penetrate the surface and possibly damage the bump pad. In fact, the wafer probe testing may involve dragging contact finger 174 across bump pad 164, which leaves a scratch across the surface of the bump pad. However, since the wafer probing is conducted on sacrificial bump pad 164, the interconnect bump pads 160 remain undamaged, in pristine condition for later formation of the bump.

In FIG. 9, sacrificial bump pads 164 and a portion of conductive link 166 are optionally removed by wet or dry etching process. In one embodiment, sacrificial bump pads 164 and the portion of conductive link 166 are removed during an etching step which is part of the formation of interconnect bump pad 160. The interconnect bump pads 160 and the remaining stub portion of conductive link 166 are available for bump process. Since no wafer probing has been conducted on interconnect bump pads 160, the bump pads are in pristine condition for the formation of bumps. The wafer foundry can perform wafer sort testing on an unbumped wafer and sell or otherwise transfer responsibility of the unbumped wafer with known KGD. Any third party bumping service provider can then form the bumps on the unbumped wafer with the KGD identified by the wafer sort testing.

An electrically conductive material is deposited over interconnect bump pads 160 using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to interconnect bump pads 160 using a suitable attachment or bonding process. In one embodiment, the conductive material is reflowed by heating the material above its melting point to form spherical balls or bumps 180. In some applications, bumps 180 are reflowed a second time to improve electrical contact to interconnect bump pads 160. The bumps can also be compression bonded to interconnect bump pads 160. Bumps 180 represent one type of interconnect structure that can be formed over interconnect bump pads 160. The interconnect structure can also use bond wires, conductive paste, stud bump, micro bump, or other electrical interconnect.

FIGS. 10a-10b illustrate a top view and cross-sectional view of semiconductor die 152 with bumps 180 formed over interconnect bump pads 160. The remaining stub portion of conductive link 166 has no electrical effect on bumps 180 or interconnect bump pads 160.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer including a plurality of semiconductor die;
    forming a plurality of interconnect bump pads over the semiconductor die;
    forming a plurality of sacrificial bump pads in proximity to the interconnect bump pads and over an active surface of the semiconductor die;
    forming a conductive link between each interconnect bump pad and proximate sacrificial bump pad;
    wafer probing including directly contacting the sacrificial bump pads while leaving a surface of the interconnect bump pads exposed; and
    transferring the semiconductor wafer to a third party after wafer probing without bumps.

2. The method of claim 1, further including forming a plurality of bumps over the interconnect bump pads.

3. The method of claim 2, further including concurrently forming the sacrificial bump pads, interconnect bump pads, and conductive link.

4. The method of claim 1, further including disposing the sacrificial bump pads in a location diagonally offset with respect to the interconnect bump pads.

5. The method of claim 1, further including removing the sacrificial bump pads and a portion of the conductive link after wafer probing.

6. The method of claim 1, wherein the sacrificial bump pads include a width different from a width of the interconnect bump pads.

7. A method of making a semiconductor device, comprising:
    providing a semiconductor wafer including a plurality of semiconductor die;
    concurrently forming a plurality of interconnect bump pads, conductive links, and a plurality of sacrificial bump pads over an active surface of the semiconductor die, the sacrificial bump pads being disposed in proximity to the interconnect bump pads, the conductive links being electrically connected between each interconnect bump pad and proximate sacrificial bump pad;
    wafer probing by directly contacting the sacrificial bump pads while the interconnect bump pads are devoid of bump material; and
    transferring the semiconductor wafer to a third party after wafer probing without bumps.

8. The method of claim 7, further including removing a portion of the conductive links.

9. The method of claim 7, further including forming a plurality of bumps over the interconnect bump pads.

10. The method of claim 7, further including disposing the sacrificial bump pads in a location diagonally offset with respect to the interconnect bump pads.

11. The method of claim 7, further including removing the sacrificial bump pads and a portion of the conductive links after wafer probing.

12. The method of claim 7, wherein the sacrificial bump pads include a width different from a width of the interconnect bump pads.

13. A method of making a semiconductor device, comprising:
    providing a semiconductor wafer including a plurality of semiconductor die;
    forming an interconnect bump pad over the semiconductor die within a bump pad array;
    forming a sacrificial bump pad within the bump pad array electrically connected to the interconnect bump pad;
    wafer probing by contacting the sacrificial bump pad without contacting the interconnect bump pad while leaving a surface of the interconnect bump pad exposed; and removing the sacrificial bump pad by an etching process while the surface of the interconnect bump pad remains exposed.

14. The method of claim 13, further including forming a conductive link between the interconnect bump pad and the sacrificial bump pad.

15. The method of claim 14, further including removing a portion of the conductive link after wafer probing.

16. The method of claim 14, further including concurrently forming the sacrificial bump pad, interconnect bump pad, and conductive link.

17. The method of claim 13, further including forming a bump over the interconnect bump pad.

18. The method of claim 13, further including disposing the sacrificial bump pad in a location diagonally offset with respect to the interconnect bump pad.

19. A method of making a semiconductor device, comprising:

provifing a semiconductor wafer containing a plurality of semiconductor die;

forming an interconnect bump pad over the semiconductor die within a bump pad array;

forming a sacrificial bump pad within the bump pad array;

forming a conductive link between the interconnect bump pad and sacrificial bump pad;

wafer probing by electrically contacting the sacrificial bump pad; and transferring the semiconductor wafer to a third party after wafer probing without bumps.

* * * * *